(12) United States Patent
Wagoner et al.

(10) Patent No.: US 11,013,070 B2
(45) Date of Patent: May 18, 2021

(54) SYSTEM AND METHOD FOR CONTROLLING MULTIPLE IGBT TEMPERATURES IN A POWER CONVERTER OF AN ELECTRICAL POWER SYSTEM

(71) Applicant: General Electric Company, Schenectady, NY (US)

(72) Inventors: Robert Gregory Wagoner, Roanoke, VA (US); Lathom Alexander Louco, Arden, NC (US)

(73) Assignee: General Electric Company, Schenectady, NY (US)

( * ) Notice: Subject to any disclaimer, the term of this patent is extended or adjusted under 35 U.S.C. 154(b) by 232 days.

(21) Appl. No.: 16/041,925

(22) Filed: Jul. 23, 2018

(65) Prior Publication Data

US 2020/0029395 A1    Jan. 23, 2020

(51) Int. Cl.
*H05B 6/06* (2006.01)
*H05B 6/44* (2006.01)
(Continued)

(52) U.S. Cl.
CPC ............ *H05B 6/06* (2013.01); *H02M 1/4216* (2013.01); *H03K 17/567* (2013.01)

(58) Field of Classification Search
CPC ...... H02P 29/68; H02P 9/007; H02P 2101/15; H02M 1/4216; H02M 1/32;
(Continued)

(56) References Cited

U.S. PATENT DOCUMENTS 5,786,973 A    7/1998  Majumdar et al.
6,630,650 B2  10/2003  Bassill et al.
(Continued)

FOREIGN PATENT DOCUMENTS

CA    2 144 615 A1   9/1996
EP    0772288 B1     4/2004
(Continued)

OTHER PUBLICATIONS

Translation of JP2013106489A,, An abnormal detection device, May 30, 2013, ProQuest (Year: 2013).*
(Continued)

*Primary Examiner* — Quang T Van
(74) *Attorney, Agent, or Firm* — Dority & Manning, P.A.

(57) ABSTRACT

A method for monitoring and controlling IGBT temperature in a power converter of an electrical power system includes generating a plurality of temperature signals from a plurality of switching devices via a plurality of temperature sensors. The method also includes selecting a primary switching device from the plurality of switching devices to estimate a primary temperature thereof. Further, the method includes determining the primary temperature of the primary switching device via a temperature measurement circuit communicatively coupled to the primary switching device. Moreover, the method includes comparing remaining temperature signals (or a function thereof) to the primary temperature via at least one comparator circuit. If one of the remaining temperature signals (or the function thereof) exceeds the primary temperature, the method also includes implementing a control action to address the increased temperature.

16 Claims, 9 Drawing Sheets

(51) Int. Cl.
*H02M 7/537* (2006.01)
*H02M 1/42* (2007.01)
*H03K 17/567* (2006.01)

(58) Field of Classification Search
CPC ............ H02M 2001/327; G01K 1/026; H03K 17/567; H05B 6/06
USPC ............... 219/635, 660, 663, 665, 667, 677; 363/131, 95, 97, 98, 132
See application file for complete search history.

(56) References Cited

U.S. PATENT DOCUMENTS

| | | | |
|---|---|---|---|
| 6,952,355 | B2 | 10/2005 | Riggio et al. |
| 8,614,595 | B2 | 12/2013 | Acatrinei |
| 8,803,048 | B2 | 8/2014 | Bassill et al. |
| 9,371,067 | B2 | 6/2016 | Dao et al. |
| 9,490,798 | B1 | 11/2016 | Charpentier et al. |
| 9,685,502 | B2 | 6/2017 | Wood |
| 1,000,886 | A1 | 6/2018 | Takizawa et al. |
| 2002/0117497 | A1 | 8/2002 | Bassill et al. |
| 2003/0192881 | A1 | 10/2003 | Bassill et al. |
| 2008/0223852 | A1 | 9/2008 | Bassill et al. |
| 2012/0300523 | A1* | 11/2012 | Sugiyama ........... H02M 3/1584 363/131 |
| 2013/0320747 | A1* | 12/2013 | Ozaki ................... B60L 15/025 301/6.5 |
| 2014/0265899 | A1 | 9/2014 | Sadwick |
| 2015/0204730 | A1 | 7/2015 | Daitoku et al. |
| 2015/0308902 | A1 | 10/2015 | Sugiura et al. |
| 2016/0063417 | A1 | 3/2016 | Mandalia et al. |
| 2017/0214341 | A1 | 7/2017 | Matthews et al. |
| 2018/0115024 | A1 | 4/2018 | Sugeno et al. |

FOREIGN PATENT DOCUMENTS

| | | | |
|---|---|---|---|
| EP | 1237272 | B1 | 11/2006 |
| JP | H11 154720 | A | 6/1999 |
| JP | 2007 228704 | A | 9/2007 |
| JP | 2007228704 | A * | 9/2007 |
| JP | 2009 135626 | A | 6/2009 |
| JP | 2013 106489 | A | 5/2013 |
| JP | 2013106489 | A * | 5/2013 |
| WO | WO2017/013823 | A1 | 1/2017 |
| WO | WO2017/070290 | A1 | 4/2017 |

OTHER PUBLICATIONS

Translation of JP2007228704A, Motor Driver, Sep. 6, 2007, ProQuest (Year: 2007).*
European Search Report, dated Dec. 19, 2019 for Application No. EP 19 18 7855.

* cited by examiner

SYSTEM AND METHOD FOR CONTROLLING MULTIPLE IGBT TEMPERATURES IN A POWER CONVERTER OF AN ELECTRICAL POWER SYSTEM

FIELD

The present disclosure relates generally to wind turbines and, more particularly, to a system and method for controlling and monitoring multiple IGBT temperatures in a power converter of an electrical power system connected to a power grid.

BACKGROUND

Wind power is considered one of the cleanest, most environmentally friendly energy sources presently available, and wind turbines have gained increased attention in this regard. A modern wind turbine typically includes a tower, generator, gearbox, nacelle, and one or more rotor blades. The rotor blades capture kinetic energy of wind using known airfoil principles. For example, rotor blades typically have the cross-sectional profile of an airfoil such that, during operation, air flows over the blade producing a pressure difference between the sides. Consequently, a lift force, which is directed from a pressure side towards a suction side, acts on the blade. The lift force generates torque on the main rotor shaft, which is geared to a generator for producing electricity.

During operation, wind impacts the rotor blades and the blades transform wind energy into a mechanical rotational torque that drives a low-speed shaft. The low-speed shaft is configured to drive the gearbox that subsequently steps up the low rotational speed of the low-speed shaft to drive a high-speed shaft at an increased rotational speed. The high-speed shaft is generally coupled to the generator so as to rotatably drive a generator rotor. In many wind turbines, the generator may be electrically coupled to a bi-directional power converter that includes a rotor-side converter joined to a line-side converter via a regulated DC link. The line side converter converts the DC power on the DC link into AC output power suitable for the electrical grid bus. In particular, switching devices (e.g. IGBTs) used in bridge circuits of the line side power converter can be modulated to convert the DC power on the DC link into AC power on the line side bus. The AC power from the power converter can be combined with the power from the generator stator to provide multi-phase power (e.g. three-phase power) having a frequency maintained substantially at the frequency of the electrical grid bus.

Such wind turbine power systems are generally referred to as a doubly-fed induction generator (DFIG). DFIG operation is typically characterized in that the rotor circuit is supplied with current from a current-regulated power converter. As such, the wind turbine produces variable mechanical torque due to variable wind speeds and the power converter ensures this torque is converted into an electrical output at the same frequency of the grid.

The IGBT(s) of the power converter are responsible for creating important waveforms in the power converter by their switching action. Such switching action can generate excessive heat, thereby increasing the temperature of the IGBTs. As such, it is important to monitor the temperature of the IGBTs to avoid the risk of failure. In conventional power converters, there are generally two sets of IGBTs on a phase module, with each IGBT set typically sitting adjacent to the heatsink in the phase module. In such systems, only one temperature is read per IGBT set.

As future power systems continue to include more IGBTs per set, it becomes increasingly important to measure each IGBT temperature. Thus, the present disclosure is directed to a system and method for measuring and controlling IGBT temperature in a power converter of an electrical power system that addresses the aforementioned issues.

BRIEF DESCRIPTION

Aspects and advantages of the invention will be set forth in part in the following description, or may be obvious from the description, or may be learned through practice of the invention.

In one aspect, the present disclosure is directed to a method for controlling temperature of a plurality of switching devices of a power converter of an electrical power system (such as a wind turbine power system or a solar power system) connected to a power grid. The method includes generating, via a plurality of temperature sensors communicatively coupled to the plurality of switching devices, a plurality of temperature signals from the plurality of switching devices. The method also includes selecting a primary switching device from the plurality of switching devices to estimate a primary temperature thereof. Further, the method includes determining, via a temperature measurement circuit communicatively coupled to the primary switching device, the primary temperature of the primary switching device based on a primary temperature signal of the plurality of temperature signals. Moreover, the method includes comparing, via at least one comparator circuit communicatively coupled to each of the plurality of temperature sensors, remaining temperature signals from the plurality of temperature signals or a function of the remaining temperature signals to the primary temperature. If one of the remaining temperature signals or the function of remaining temperature signals exceeds the primary temperature, the method also includes implementing a control action.

In one embodiment, the function of the remaining temperature signals may include, for example, a sum of the remaining temperature signals or an average of the remaining temperature signals. In another embodiment, the method may also include applying hysteresis to the plurality of temperature signals.

In further embodiments, the plurality of switching devices may include insulated gate bipolar transistors (IGBTs). In particular embodiments, the plurality of temperature sensors may be thermistors.

In additional embodiments, the method may include comparing the remaining temperature signals from the plurality of temperature signals or the function of the remaining temperature signals to the primary temperature via at least two comparator circuits communicatively coupled to the plurality of temperature sensors.

In several embodiments, the step of implementing the control action may include tripping the electrical power system, starting a counter, triggering an alarm, sending a notification to a system controller, and/or any other suitable control action or combinations thereof.

In yet another embodiment, the method may include specifically selecting the primary switching device from the plurality of switching devices. Alternatively, the method may include randomly selecting the primary switching device from the plurality of switching devices.

In another aspect, the present disclosure is directed to a temperature control system for a plurality of switching devices of a power converter of a wind turbine power system connected to a power grid. The switching devices include a primary switching device and a plurality of secondary switching devices. The temperature control system includes a plurality of temperature sensors communicatively coupled to the plurality of switching devices. The plurality of temperature sensors are configured to generate a plurality of temperature signals. The temperature control system also includes a temperature measurement circuit communicatively coupled to the primary switching device for estimating a primary temperature thereof based on a primary temperature signal of the plurality of temperature signals. Further, the temperature control system includes at least one comparator circuit communicatively coupled to each of the plurality of temperature sensors. The comparator circuit(s) is configured to compare remaining temperature signals from the plurality of temperature signals or a function of the remaining temperature signals to the primary temperature. Moreover, the temperature control system includes a controller communicatively coupled to the temperature measurement circuit and the comparator circuit(s). As such, the controller is configured to implement a control action if one of the remaining temperature signals or the function of remaining temperature signals exceeds the primary temperature. It should be understood that the temperature control system may further include any of the additional features as described herein.

In yet another aspect, the present disclosure is directed to a method for controlling temperature of a plurality of switching devices of a power converter of an electrical power system connected to a power grid. The method includes generating, via a plurality of temperature sensors communicatively coupled to the plurality of switching devices, a plurality of temperature signals from the plurality of switching devices. Further, the method includes selecting a primary switching device from the plurality of switching devices to estimate a primary temperature thereof. Moreover, the method includes comparing, via an operational amplifier, the plurality of temperature signals to at least one of each other or to the primary temperature. In addition, if one of the plurality of temperature signals varies from remaining temperature signals by a predetermined amount, the method includes implementing, via a controller, a control action.

In one embodiment, the method may further include comparing, via the operational amplifier, each of the plurality of temperature signals to each other. In such embodiments, the temperature sensors may be aligned in a bridge formation.

It should be understood that the method may further include any of the additional features and/or steps as described herein.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
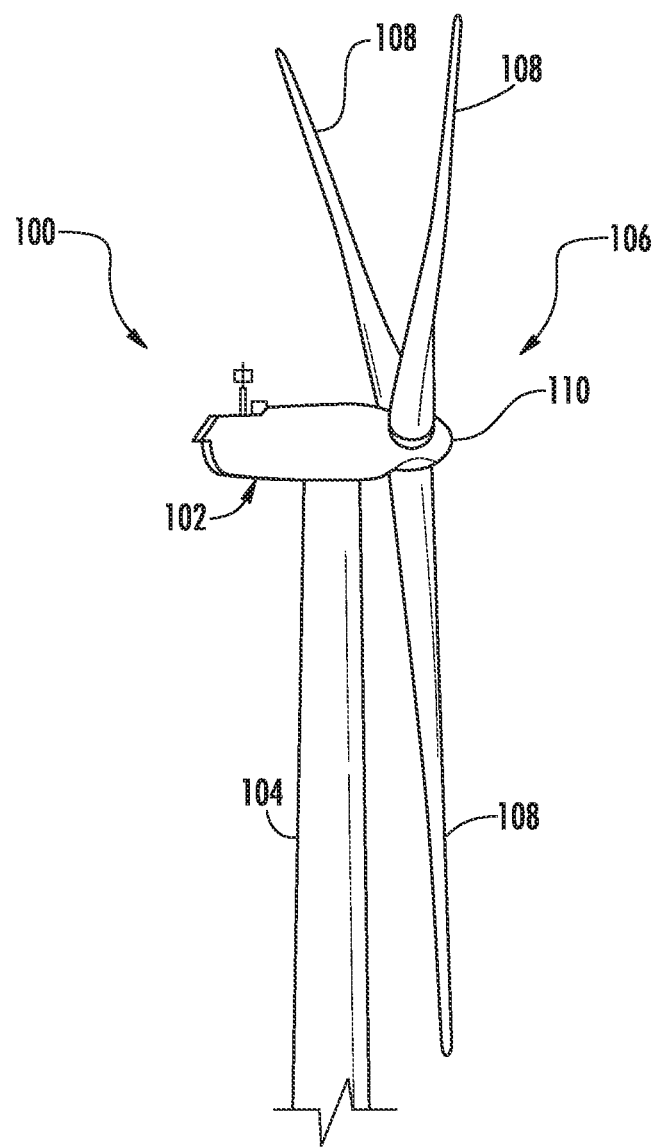
FIG. 1 illustrates a perspective view of a portion of one embodiment of a wind turbine according to the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present disclosure relates to systems and methods for monitoring and controlling IGBT temperature in a power converter of an electrical power system (such as a wind turbine power system or a solar power system). In one embodiment, the method includes generating a plurality of temperature signals from the plurality of switching devices via a plurality of temperature sensors. The method also includes selecting a primary switching device from the plurality of switching devices to estimate a primary temperature thereof. Further, the method includes estimating the primary temperature of the primary switching device via a temperature measurement circuit communicatively coupled to the primary switching device. Moreover, the method includes comparing remaining temperature signals (or a function thereof) to the primary temperature via at least one comparator circuit. If one of the remaining temperature signals (or the function thereof) exceeds the primary temperature, the method also includes implementing a control action to address the increased temperature.

Accordingly, the present disclosure provides numerous advantages over prior art systems and methods. For example, the systems and methods of the present disclosure are simplified and compact as compared to prior art systems. In addition, the temperature control systems of the present disclosure also operate as a failsafe, leveraging multiple sensors to monitor the temperature of the IGBT set. As such, the IGBTs of the present disclosure are provided with wear out protection as well as enhanced converter regulation (e.g. temperature and control). Moreover, the system of the present disclosure provides a way to handle an infinite amount of IGBT temperature feedbacks in an increasingly complex system.

Figure 2:
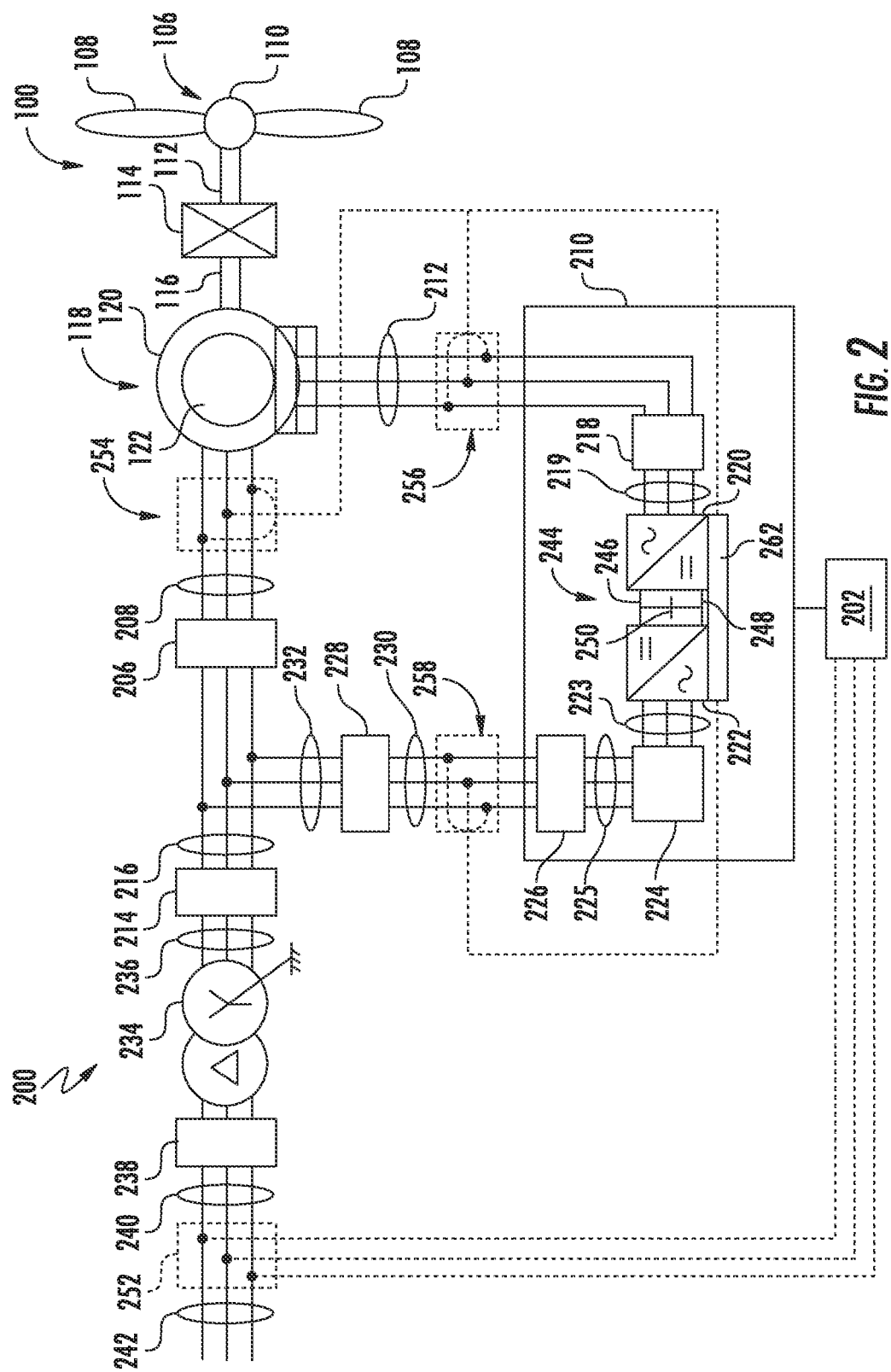
FIG. 2 illustrates a schematic view of one embodiment of an electrical power system suitable for use with the wind turbine shown in FIG. 1.

Referring now to the drawings, FIG. 1 illustrates a perspective view of a portion of one embodiment of a wind turbine 100 according to the present disclosure that is configured to implement the method as described herein. The wind turbine 100 includes a nacelle 102 that typically houses a generator 118 (FIG. 2). The nacelle 102 is mounted on a tower 104 having any suitable height that facilitates operation of wind turbine 100 as described herein. The wind turbine 100 also includes a rotor 106 that includes three blades 108 attached to a rotating hub 110. Alternatively, the wind turbine 100 may include any number of blades 108 that facilitates operation of the wind turbine 100 as described herein.

Referring now to FIG. 2, a schematic view of one embodiment of an electrical power system 200 that may be used with the wind turbine 100 is illustrated. During operation, wind impacts the blades 108 and the blades 108 transform wind energy into a mechanical rotational torque that rotatably drives a low-speed shaft 112 via the hub 110. The low-speed shaft 112 is configured to drive a gearbox 114 that subsequently steps up the low rotational speed of the low-speed shaft 112 to drive a high-speed shaft 116 at an increased rotational speed. The high-speed shaft 116 is generally rotatably coupled to a generator 118 so as to rotatably drive a generator rotor 122 having field winding (not shown). More specifically, in one embodiment, the generator 118 may be a wound rotor, three-phase, doubly-fed induction (asynchronous) generator (DFIG) that includes a generator stator 120 magnetically coupled to a generator rotor 122. It should be understood that the electrical power system may also encompass any other suitable power generation system in addition to DFIG systems, including but not limited to permanent magnet generator (PMG) systems and/or any system connected to a power grid that includes a disconnect device, AC capacitance, and a power converter.

As such, a rotating magnetic field may be induced by the generator rotor 122 and a voltage may be induced within a generator stator 120 that is magnetically coupled to the generator rotor 122. In such embodiments, the generator 118 is configured to convert the rotational mechanical energy to a sinusoidal, three-phase alternating current (AC) electrical energy signal in the generator stator 120. The associated electrical power can be transmitted to a main transformer 234 via a stator bus 208, a stator synchronizing switch 206, a system bus 216, a main transformer circuit breaker 214, and a generator-side bus 236. The main transformer 234 steps up the voltage amplitude of the electrical power such that the transformed electrical power may be further transmitted to a power grid 243 via a grid circuit breaker 238, a breaker-side bus 240, and a grid bus 242.

Figure 3:
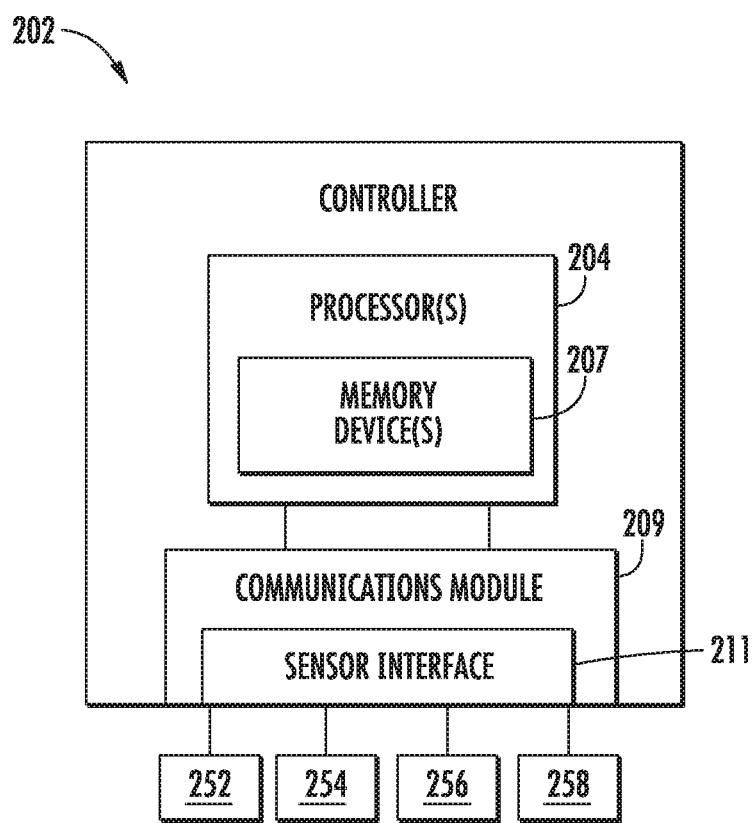
FIG. 3 illustrates a block diagram of one embodiment of a controller suitable for use with the wind turbine shown in FIG. 1.

In addition, the electrical power system 200 may include a wind turbine controller 202 configured to control any of the components of the wind turbine 100 and/or implement the method steps as described herein. For example, as shown particularly in FIG. 3, the controller 202 may include one or more processor(s) 204 and associated memory device(s) 207 configured to perform a variety of computer-implemented functions (e.g., performing the methods, steps, calculations and the like and storing relevant data as disclosed herein). Additionally, the controller 202 may also include a communications module 209 to facilitate communications between the controller 202 and the various components of the wind turbine 100, e.g. any of the components of FIG. 2. Further, the communications module 209 may include a sensor interface 211 (e.g., one or more analog-to-digital converters) to permit signals transmitted from one or more sensors to be converted into signals that can be understood and processed by the processors 204. It should be appreciated that the sensors (e.g. sensors 252, 254, 256, 258) may be communicatively coupled to the communications module 209 using any suitable means. For example, as shown in FIG. 3, the sensors 252, 254, 256, 258 may be coupled to the sensor interface 211 via a wired connection. However, in other embodiments, the sensors 252, 254, 256, 258 may be coupled to the sensor interface 211 via a wireless connection, such as by using any suitable wireless communications protocol known in the art. As such, the processor 204 may be configured to receive one or more signals from the sensors.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor 204 is also configured to compute advanced control algorithms and communicate to a variety of Ethernet or serial-based protocols (Modbus, OPC, CAN, etc.). Additionally, the memory device(s) 207 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 207 may generally be configured to store suitable computer-readable instructions that, when implemented by the processor(s) 204, configure the controller 202 to perform the various functions as described herein.

Referring back to FIG. 2, the generator stator 120 may be electrically coupled to a stator synchronizing switch 206 via a stator bus 208. In one embodiment, the generator rotor 122 may be electrically coupled to a bi-directional power conversion assembly 210 or power converter via a rotor bus 212. Alternatively, the generator rotor 122 may be electrically coupled to the rotor bus 212 via any other device that facilitates operation of electrical power system 200 as described herein. In a further embodiment, the stator synchronizing switch 206 may be electrically coupled to a main transformer circuit breaker 214 via a system bus 216.

The power conversion assembly 210 may include a rotor filter 218 that is electrically coupled to the generator rotor 122 via the rotor bus 212. In addition, the rotor filter 218 may include a rotor-side reactor. A rotor filter bus 219 electrically couples the rotor filter 218 to a rotor-side power converter 220. Further, the rotor-side power converter 220 may be electrically coupled to a line-side power converter 222 via a single direct current (DC) link 244. Alternatively, the rotor-side power converter 220 and the line-side power converter 222 may be electrically coupled via individual and separate DC links. In addition, as shown, the DC link 244 may include a positive rail 246, a negative rail 248, and at least one capacitor 250 coupled therebetween.

In addition, a line-side power converter bus 223 may electrically couple the line-side power converter 222 to a line filter 224. Also, a line bus 225 may electrically couple the line filter 224 to a line contactor 226. In addition, the line filter 224 may include a line-side reactor. Moreover, the line contactor 226 may be electrically coupled to a conversion circuit breaker 228 via a conversion circuit breaker bus 230. In addition, the conversion circuit breaker 228 may be electrically coupled to the main transformer circuit breaker 214 via system bus 216 and a connection bus 232. The main transformer circuit breaker 214 may be electrically coupled to an electric power main transformer 234 via a generator-side bus 236. The main transformer 234 may be electrically coupled to a grid circuit breaker 238 via a breaker-side bus 240. The grid circuit breaker 238 may be connected to the electric power transmission and distribution grid via a grid bus 242.

Figure 4:
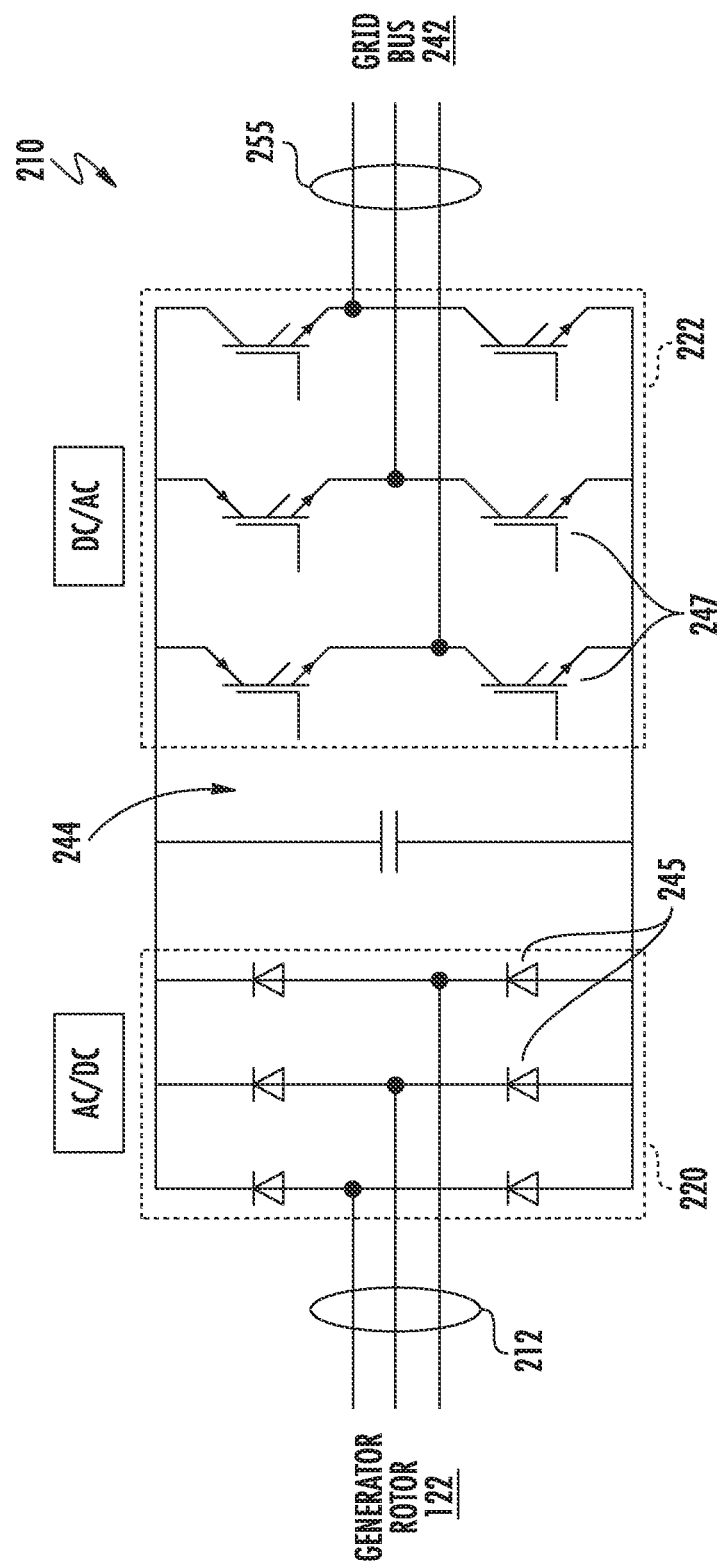
FIG. 4 illustrates a schematic diagram of one embodiment of a power converter of a wind turbine according to the present disclosure.

Referring particularly to FIGS. 2 and 4, alternating current (AC) power generated at the generator stator 120 by rotation of the rotor 106 is provided via a dual path to the grid bus 242. The dual paths are defined by the stator bus 208 and the rotor bus 212. On the rotor bus side 212, sinusoidal multi-phase (e.g. three-phase) AC power is provided to the power conversion assembly 210. The rotor-side power converter 220 converts the AC power provided from the rotor bus 212 into DC power and provides the DC power to the DC link 244. Switching devices 245 (e.g. diodes) used in bridge circuits of the rotor side power converter 220 can be modulated to convert the AC power provided from the rotor bus 212 into DC power suitable for the DC link 244.

The line side converter 222 converts the DC power on the DC link 244 into AC output power suitable for the electrical grid bus 242. In particular, switching devices 247 (e.g. IGBTs) used in bridge circuits of the line side power converter 222 can be modulated to convert the DC power on the DC link 244 into AC power on the line side bus 225. The AC power from the power conversion assembly 210 can be combined with the power from the stator 120 to provide multi-phase power (e.g. three-phase power) having a frequency maintained substantially at the frequency of the electrical grid bus 242 (e.g. 50 Hz/60 Hz).

It should be understood that the rotor-side power converter 220 and the line-side power converter 222 may have any configuration using any switching devices that facilitate operation of electrical power system 200 as described herein. For example, FIG. 4 illustrates a simplified schematic diagram of one embodiment of a variable frequency drive (VFD) that maintains a constant electrical frequency output on the grid side of the generator 118. As shown, the VFD configuration includes a six-switch voltage-sourced rectifier on the rotor side converter 220, a DC link capacitor 249 to minimize DC voltage variation, and a six-switch voltage-sourced inverter utilizing pulse width modulation on the grid side. Rotor-side switching devices 245 are often diodes or silicon controlled rectifiers (SCR), while the grid side-switching devices 247 are often insulated gate bipolar transistors (IGBTs). As such, the magnitude and electrical frequency of the current supplied to the generator rotor 122 through the VFD may be varied to account for changes in the rotor shaft speed and to maintain a constant output on the generator stator winding.

Further, the power conversion assembly 210 may be coupled in electronic data communication with the turbine controller 202 and/or a separate or integral converter controller 262 to control the operation of the rotor-side power converter 220 and the line-side power converter 222. For example, during operation, the controller 202 may be configured to receive one or more voltage and/or electric current measurement signals from the first set of voltage and electric current sensors 252. Thus, the controller 202 may be configured to monitor and control at least some of the operational variables associated with the wind turbine 100 via the sensors 252. In the illustrated embodiment, each of the sensors 252 may be electrically coupled to each one of the three phases of the power grid bus 242. Alternatively, the sensors 252 may be electrically coupled to any portion of electrical power system 200 that facilitates operation of electrical power system 200 as described herein. In addition to the sensors described above, the sensors may also include a second set of voltage and electric current sensors 254, a third set of voltage and electric current sensors 256, a fourth set of voltage and electric current sensors 258 (all shown in FIG. 2), and/or any other suitable sensors.

It should also be understood that any number or type of voltage and/or electric current sensors 252, 254, 256, 258 may be employed within the wind turbine 100 and at any location. For example, the sensors may be current transformers, shunt sensors, rogowski coils, Hall Effect current sensors, Micro Inertial Measurement Units (MIMUs), or similar, and/or any other suitable voltage or electric current sensors now known or later developed in the art.

Thus, the converter controller 262 is configured to receive one or more voltage and/or electric current feedback signals from the sensors 252, 254, 256, 258. More specifically, in certain embodiments, the current or voltage feedback signals may include at least one of line feedback signals, line-side converter feedback signals, rotor-side converter feedback signals, or stator feedback signals. For example, as shown in the illustrated embodiment, the converter controller 262 receives voltage and electric current measurement signals from the second set of voltage and electric current sensors 254 coupled in electronic data communication with stator bus 208. The converter controller 262 may also receive the third and fourth set of voltage and electric current measurement signals from the third and fourth set of voltage and electric current sensors 256, 258. In addition, the converter controller 262 may be configured with any of the features described herein in regards to the main controller 202. As such, the converter controller 262 is configured to implement the various method steps as described herein and may be configured similar to the turbine controller 202.

Figure 5:
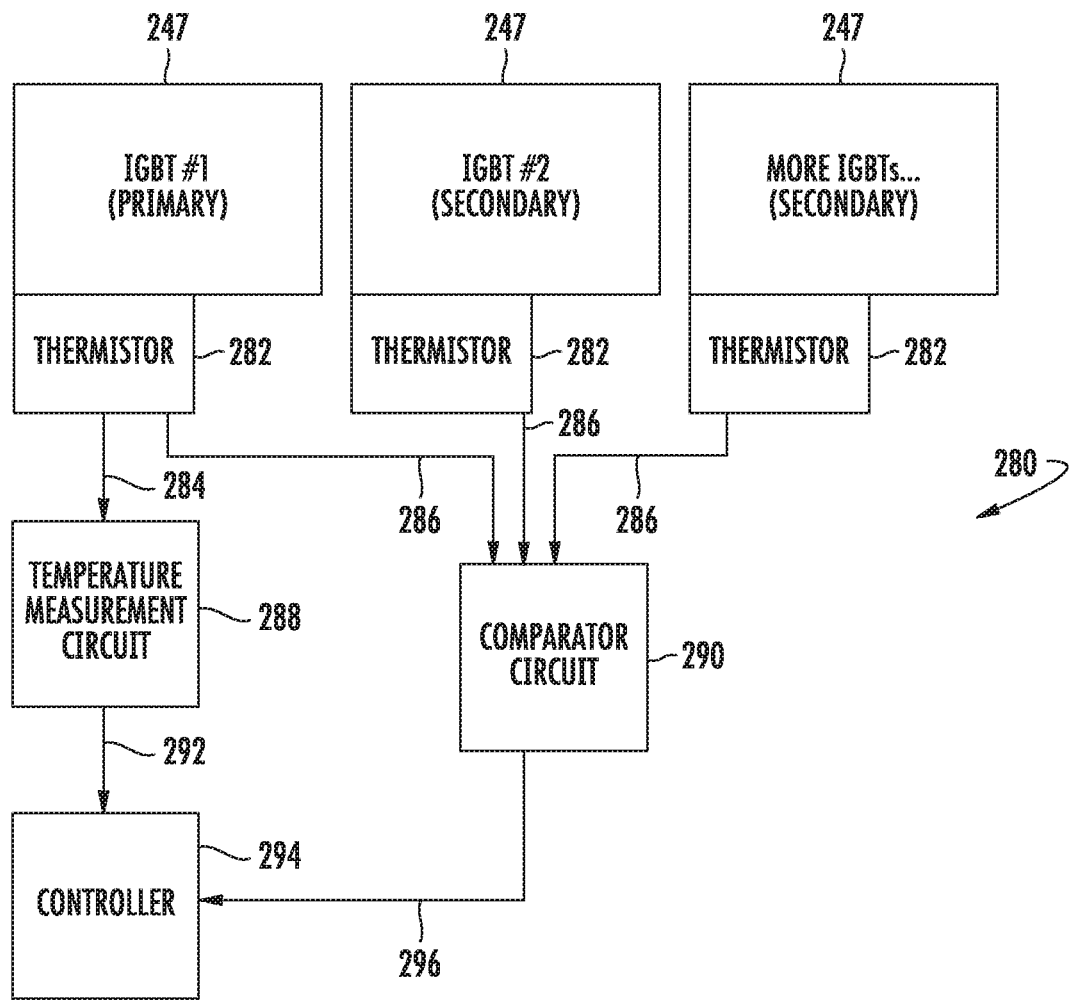
FIG. 5 illustrates a schematic diagram of one embodiment of a temperature control system for switching devices of a power converter of a wind turbine according to the present disclosure.
Figure 6:
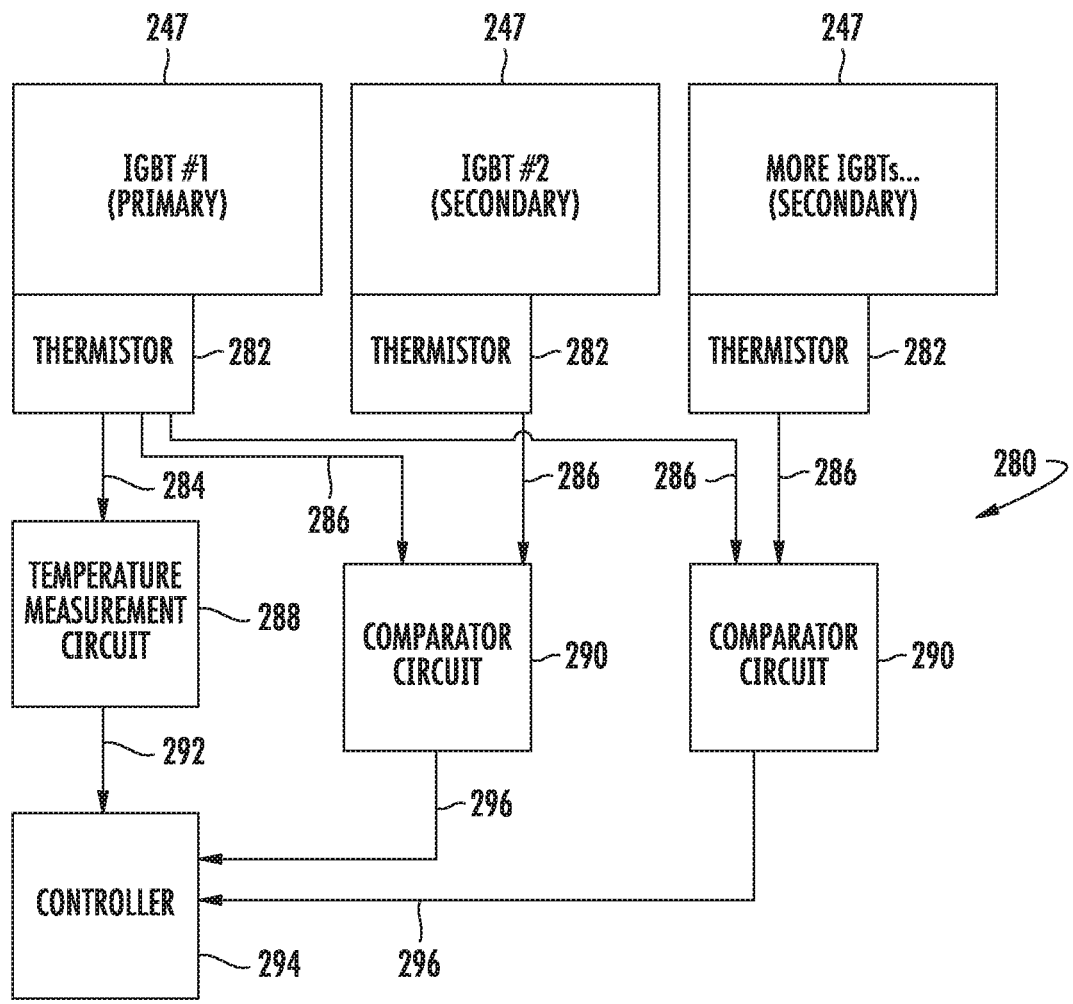
FIG. 6 illustrates a schematic diagram of another embodiment of a temperature control system for switching devices of a power converter of a wind turbine according to the present disclosure.

Referring now to FIGS. 5 and 6, schematic diagrams of various embodiments of a temperature control system 280 for the IGBTs 247 of the power converter 210 according to the present disclosure are illustrated. As shown, the IGBTs include a primary IGBT and a plurality of secondary IGBTs. It should be understood that any of the IGBTs 247 can act as the primary IGBT and the primary IGBT is simply chosen as a point of reference. Further, as shown, the temperature control system 280 also includes a plurality of temperature sensors 282 communicatively coupled to the plurality of IGBTs 247. For example, in one embodiment, the temperature sensors 282 may be thermistors. Thus, as shown, the temperature sensors 282 are configured to generate a plurality of temperature signals 284, 286. Moreover, as shown, the temperature control system 280 also includes a temperature measurement circuit 288 communicatively coupled to the primary IGBT for estimating a primary temperature 292 thereof based on a primary temperature signal 284 of the plurality of temperature signals 284, 286.

Further, as shown, the temperature control system 280 may include at least one comparator circuit 290 communicatively coupled to each of the plurality of temperature sensors 282. For example, as shown in FIG. 5, the temperature control system 280 includes a single summing comparator circuit 290. Alternatively, as shown in FIG. 6, the temperature control system 280 includes two comparator circuits 290. As such, the comparator circuit(s) 290 is configured to compare each of the remaining temperature signals 286 (or a function thereof) to the primary temperature signal 284. Moreover, as shown, the temperature control system 280 may also include a controller 294 communicatively coupled to the temperature measurement circuit 288 and the comparator circuit(s) 290. Thus, as shown, the controller 294 is configured to receive the comparison 296 of the remaining temperature signals 286 and the primary temperature 292 and implement a control action if one of the remaining temperature signals 286 or the function of remaining temperature signals 286 exceeds the primary temperature 292.

Figure 7:
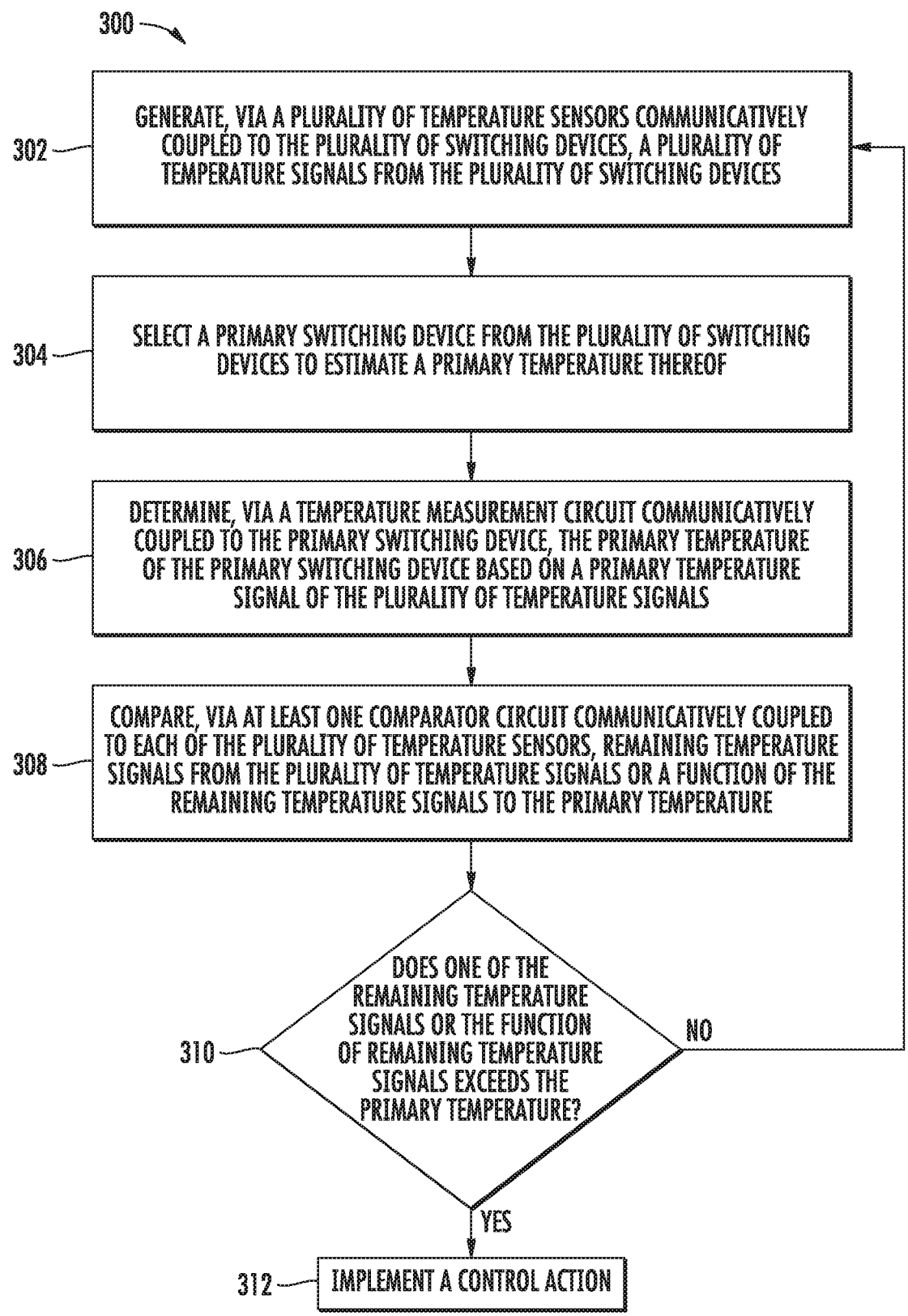
FIG. 7 illustrates a flow diagram of one embodiment of a method for controlling temperature of a plurality of switching devices of a power converter of an electrical power system connected to a power grid according to the present disclosure.

Referring now FIG. 7, a flow diagram of one embodiment of a method 300 for controlling temperature of a plurality of switching devices of a power converter of an electrical power system (such as a wind turbine power system or a solar power system) connected to a power grid is illustrated. In general, the method 300 will be described herein with reference to the wind turbine 100, power system 200, and temperature control system 280 described above with reference to FIGS. 1-6. However, it should be appreciated by those of ordinary skill in the art that the disclosed method 300 may generally be utilized to control the operation of any other suitable power system (such as wind and/or solar power systems) having any suitable configuration, and/or systems having any other suitable system configuration. In addition, although FIG. 7 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

As shown at (302), the method 300 includes generating, via the plurality of temperature sensors 282, the plurality of temperature signals 284, 286. In one embodiment, the method 300 may also include applying hysteresis to the plurality of temperature signals 284, 286. As shown at (304), the method 300 includes selecting a primary switching device from the plurality of switching devices to estimate the primary temperature 292 thereof. In another embodiment, the method 300 may include specifically selecting the primary switching device from the plurality of switching devices 247. Alternatively, the method 300 may include randomly selecting the primary switching device from the plurality of switching devices 247.

Referring still to FIG. 7, as shown at (306), the method 300 includes determining, via the temperature measurement circuit 288, the primary temperature 292 of the primary switching device based on the primary temperature signal 284. As shown at (308), the method 300 includes comparing, via the comparator circuit(s) 290, remaining temperature signals 286 or a function of the remaining temperature signals 286 to the primary temperature 292. More specifically, in one embodiment, the function of the remaining temperature signals 286 may include, for example, a sum of the remaining temperature signals 286 or an average of the remaining temperature signals 286.

As shown at (310), the method 300 includes determining if one of the remaining temperature signals 286 or the function of remaining temperature signals 286 exceeds the primary temperature 292. If so, in certain embodiments, the controller(s) 294 may be configured to evaluate whether to move forward with a control action or not. For example, the controller(s) 294 may be configured to implement a hysteresis check via a historical computation, gather other power converter temperature information for comparison, analyze converter performance and demand, etc. After such optional evaluation, as shown at (312), the method 300 also includes implementing a control action. For example, in one embodiment, the control action may include tripping the electrical power system 200, starting a counter, triggering an alarm, sending a notification to one of the controllers 202, 262, and/or any other suitable control action or combinations thereof.

In additional embodiments, the method 300 may include comparing the remaining temperature signals 286 from the plurality of temperature signals or the function of the remaining temperature signals 286 to the primary temperature via at least two comparator circuits communicatively coupled to the plurality of temperature sensors.

Figure 8:
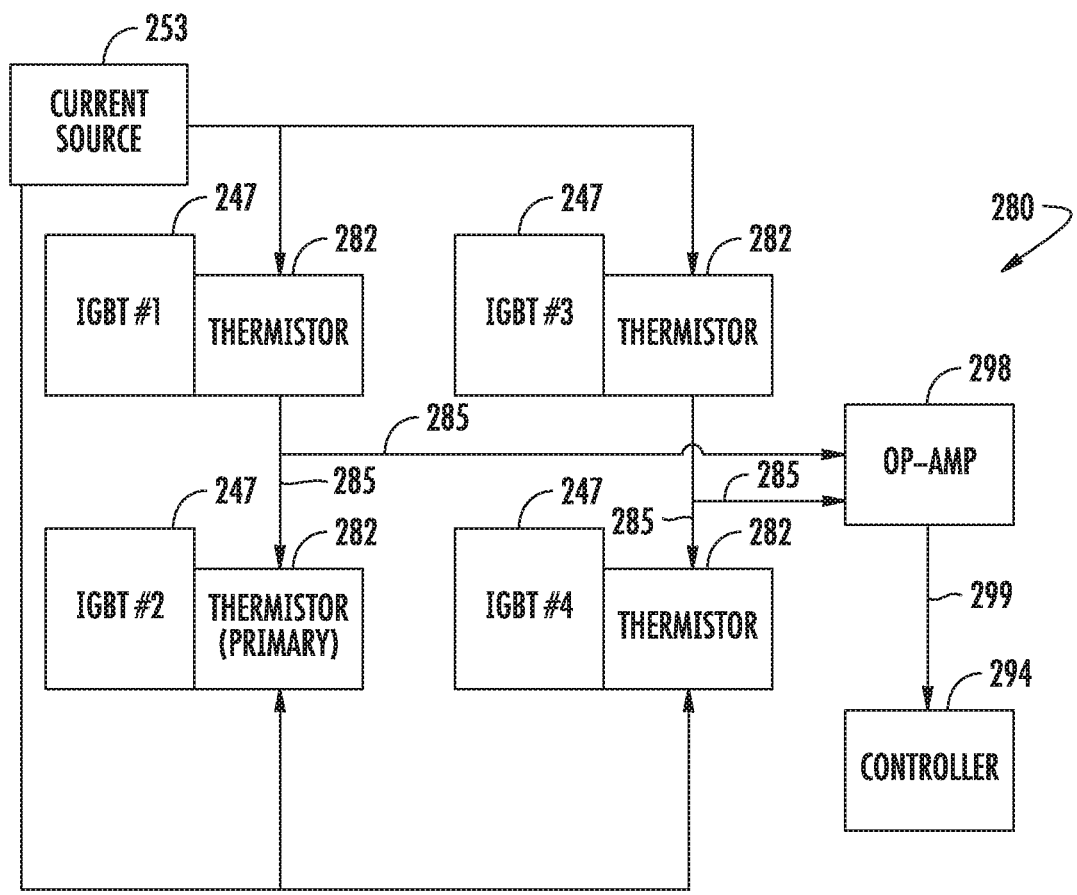
FIG. 8 illustrates a schematic diagram of still another embodiment of a temperature control system for switching devices of a power converter of a wind turbine according to the present disclosure.

Referring now to FIG. 8, schematic diagram of another embodiment of a temperature control system 280 for the IGBTs 247 of the power converter 210 according to the present disclosure are illustrated. As shown, the temperature control system 280 includes a current source 253 communicatively coupled to a plurality of temperature sensors 282 (such as thermistors) that are communicatively coupled to the plurality of IGBTs 247, an operational amplifier 298, and a controller 294. Further, as shown, one of the temperature sensors 282 may be selected and designated as the primary temperature sensor. In addition, as shown in FIG. 8, the temperature sensors 282 may be aligned in a bridge formation.

Moreover, as shown, the temperature sensors 282 are configured to generate a plurality of temperature signals 285. Thus, the operational amplifier 298 is configured to receive the temperature signals 285. Accordingly, the operational amplifier 298 is configured to process the temperature signals 285 and send the processed signal 299 to the controller 294. It should be understood that the illustrated operational amplifier 298 may include a plurality of operational amplifiers, including the option of two operational amplifiers connected to create a "window detector." In addition, the operational amplifier 298 may include comparator(s) instead of operational amplifier(s). Similarly, the comparator(s) described herein may also include a plurality of comparators, including the option of two comparators connected to create a "window detector."

Figure 9:
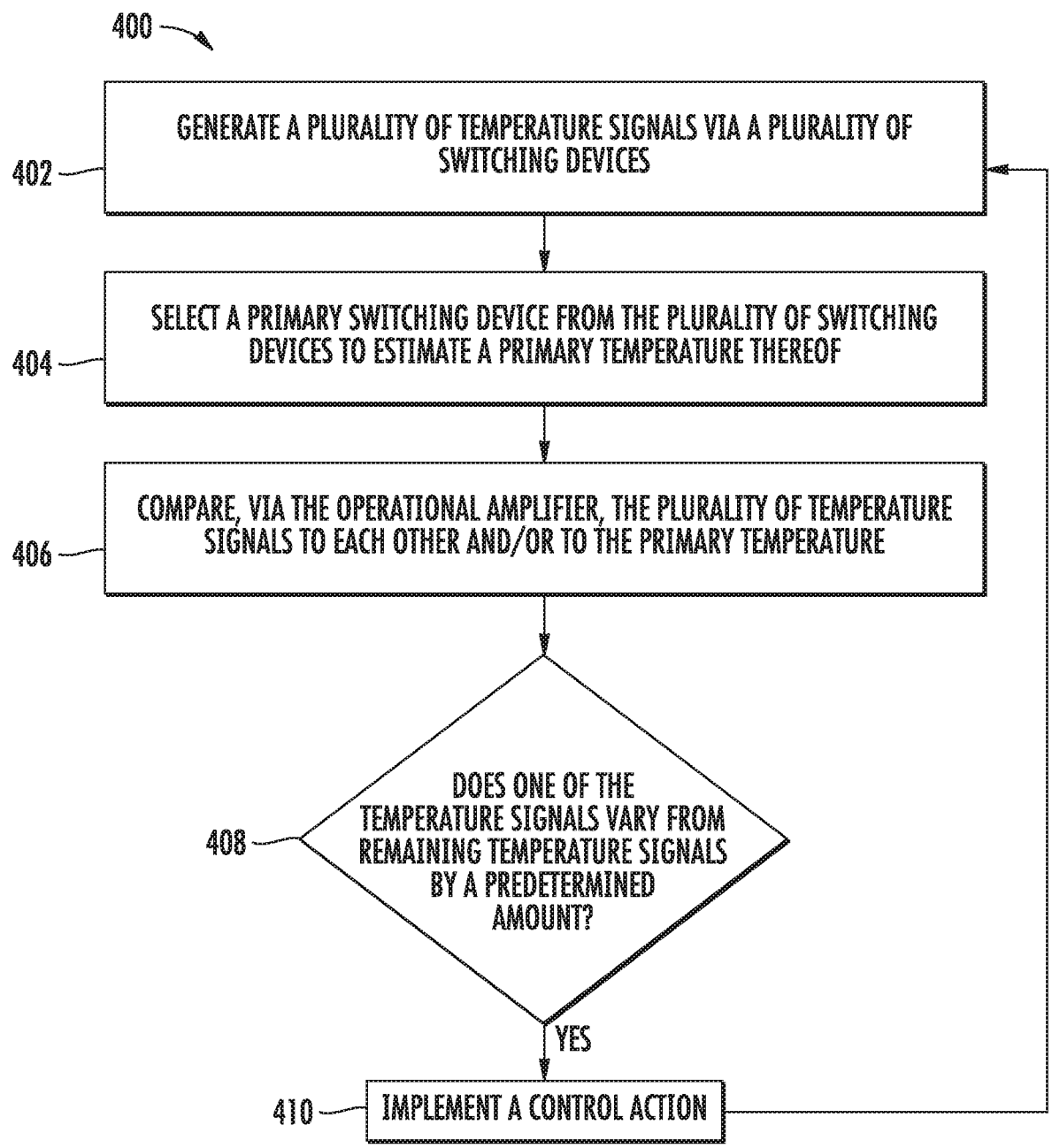
FIG. 9 illustrates a flow diagram of another embodiment of a method for controlling temperature of a plurality of switching devices of a power converter of an electrical power system connected to a power grid according to the present disclosure.

Referring now FIG. 9, a flow diagram of another embodiment of a method 400 for controlling temperature of a plurality of switching devices of a power converter of an electrical power system connected to a power grid is illustrated. In general, the method 400 will be described herein with reference to the temperature control system 280 described above with reference to FIGS. 8 and 9. However, it should be appreciated by those of ordinary skill in the art that the disclosed method 300 may generally be utilized to control the operation of any other suitable power system (such as wind and/or solar power systems) having any suitable configuration, and/or systems having any other suitable system configuration. In addition, although FIG. 10 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

As shown at (402), the method 400 includes generating a plurality of temperature signals 285 via the IGBTs 247. As shown at (404), the method 400 includes selecting a primary switching device from the plurality of switching devices to estimate a primary temperature thereof. As shown at (406), the method 400 includes comparing, via the operational amplifier 298, the plurality of temperature signals 285 to each other and/or to the primary temperature. For example, where the temperature sensors 282 are connected in a bridge formation (FIG. 8), the operational amplifier 298 may be configured to compare each of the temperature signals 285 to each other.

In addition, as shown at (408), the method 400 includes determining if one of the temperature signals 285 varies from remaining temperature signals 285 by a predetermined amount. If so, as shown at (410), the method 400 includes implementing a control action, such as any of the control actions described herein. For example, in one embodiment, if any one of the secondary temperature signals 285 moves away from the others (since they should all be the same), then the circuit is configured to generate an error to indicate the presence of the change.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for controlling temperature of a plurality of switching devices of a power converter of an electrical power system connected to a power grid, the method comprising:

generating, via a plurality of temperature sensors communicatively coupled to the plurality of switching devices, a plurality of temperature signals from the plurality of switching devices, the plurality of temperature sensors comprising thermistors, wherein each of the plurality of switching devices comprises one of the plurality of temperature sensors coupled thereto;

selecting a primary switching device from the plurality of switching devices to estimate a primary temperature thereof;

communicatively coupling a primary temperature measurement circuit to the primary switching device only;

determining, via a primary temperature measurement circuit, the primary temperature of the primary switching device based on a primary temperature signal of the plurality of temperature signals;

communicatively coupling at least one comparator circuit to each of the plurality of temperature sensors, the at least one comparator circuit being separate and apart from the primary temperature measurement circuit;

comparing, via the at least one comparator circuit, each of remaining temperature signals from the plurality of temperature signals or a function of each of the remaining temperature signals to the primary temperature individually; and, implementing a control action when any one of the remaining temperature signals or the function of any one of the remaining temperature signals exceeds the primary temperature.

2. The method of claim 1, wherein the function of the remaining temperature signals comprises at least one of a sum of the remaining temperature signals or an average of the remaining temperature signals.

3. The method of claim 1, further comprising applying hysteresis to the plurality of temperature signals.

4. The method of claim 1, wherein the plurality of switching devices comprise insulated gate bipolar transistors (IGBTs).

5. The method of claim 1, further comprising comparing the remaining temperature signals from the plurality of temperature signals or the function of the remaining temperature signals to the primary temperature via at least two comparator circuits communicatively coupled to the plurality of temperature sensors.

6. The method of claim 1, wherein implementing the control action further comprises at least one of tripping the electrical power system, starting a counter, triggering an alarm, or sending a notification to a system controller.

7. The method of claim 1, further comprising specifically selecting the primary switching device from the plurality of switching devices.

8. The method of claim 1, further comprising randomly selecting the primary switching device from the plurality of switching devices.

9. The method of claim 1, wherein the electrical power system comprises at least one of a wind turbine power system or a solar power system.

10. A temperature control system for a plurality of switching devices of a power converter of a wind turbine power system connected to a power grid, the plurality of switching devices having a primary switching device and a plurality of secondary switching devices, the temperature control system comprising:

a plurality of temperature sensors communicatively coupled to the plurality of switching devices, the plurality of temperature sensors configured to generate a plurality of temperature signals, the plurality of temperature sensors comprising thermistors, each of the plurality of switching devices comprises one of the plurality of temperature sensors coupled thereto;

a primary temperature measurement circuit communicatively coupled only to the primary switching device for estimating a primary temperature thereof based on a primary temperature signal of the plurality of temperature signals;

at least one comparator circuit communicatively coupled to each of the plurality of temperature sensors, the at least one comparator circuit being separate and apart from the primary temperature measurement circuit, the at least one comparator circuit configured to compare each of remaining temperature signals from the plurality of temperature signals or a function of each of the remaining temperature signals to the primary temperature individually; and, a controller communicatively coupled to the temperature measurement circuit and the at least one comparator circuit, the controller configured to implement a control action when any of the remaining temperature signals or the function of any of remaining temperature signals exceeds the primary temperature.

11. The temperature control system of claim 10, wherein the function of the remaining temperature signals comprises at least one of a sum of the remaining temperature signals or an average of the remaining temperature signals.

12. The temperature control system of claim 10, wherein the plurality of switching devices comprise insulated gate bipolar transistors (IGBTs).

13. The temperature control system of claim 10, wherein the plurality of switching devices comprises at least four IGBTs.

14. The temperature control system of claim 10, wherein the at least one comparator circuit comprises at least one of an integrated circuit or a thermistor-based circuit.

15. The temperature control system of claim 10, further comprising at least two comparator circuits.

16. The temperature control system of claim 10, wherein the control action further comprises at least one of tripping the electrical power system, starting a counter, triggering an alarm, or sending a notification to a system controller.

* * * * *